United States Patent
Bae et al.

(10) Patent No.: US 8,465,901 B2
(45) Date of Patent: *Jun. 18, 2013

(54) METHODS OF ADJUSTING DIMENSIONS OF RESIST PATTERNS

(75) Inventors: Young Cheol Bae, Weaston, MA (US); Thomas Cardolaccia, Newton, MA (US); Yi Liu, Wayland, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 264 days.

This patent is subject to a terminal disclaimer.

(21) Appl. No.: 12/825,096

(22) Filed: Jun. 28, 2010

(65) Prior Publication Data

US 2010/0330471 A1    Dec. 30, 2010

Related U.S. Application Data

(60) Provisional application No. 61/269,600, filed on Jun. 26, 2009, provisional application No. 61/281,681, filed on Nov. 19, 2009.

(51) Int. Cl.
- *G03F 7/00* (2006.01)
- *G03F 7/004* (2006.01)
- *G03F 7/028* (2006.01)
- *G03F 7/40* (2006.01)

(52) U.S. Cl.
USPC ........ 430/270.1; 430/312; 430/330; 430/331; 430/913

(58) Field of Classification Search
USPC ............. 430/270.1, 312, 330, 331, 913
See application file for complete search history.

(56) References Cited

U.S. PATENT DOCUMENTS

| | | | |
|---|---|---|---|
| 5,100,696 A * | 3/1992 | Talvalkar et al. | 427/130 |
| 6,218,085 B1 | 4/2001 | Molloy et al. | |
| 6,511,792 B2 * | 1/2003 | Fujino et al. | 430/311 |
| 6,743,562 B2 * | 6/2004 | Momota et al. | 430/170 |
| 7,399,582 B2 * | 7/2008 | Takahashi et al. | 430/331 |
| 7,527,918 B2 * | 5/2009 | Kondoh et al. | 430/312 |
| 8,067,146 B2 * | 11/2011 | Jung | 430/311 |
| 8,173,358 B2 * | 5/2012 | Kim et al. | 430/312 |
| 2002/0081504 A1 * | 6/2002 | Kong et al. | 430/18 |
| 2004/0121615 A1 * | 6/2004 | Kaneko et al. | 438/758 |
| 2006/0127816 A1 * | 6/2006 | Kang et al. | 430/312 |
| 2008/0199814 A1 * | 8/2008 | Brzozowy et al. | 430/312 |
| 2009/0149026 A1 | 6/2009 | Zhou et al. | |
| 2009/0253080 A1 * | 10/2009 | Dammel et al. | 430/324 |
| 2010/0090372 A1 * | 4/2010 | Ishikawa et al. | 264/342 R |
| 2010/0190104 A1 * | 7/2010 | Nakamura et al. | 430/270.1 |
| 2010/0330498 A1 | 12/2010 | Bae et al. | |
| 2011/0117490 A1 * | 5/2011 | Bae et al. | 430/270.1 |

FOREIGN PATENT DOCUMENTS

EP    1 975 718    10/2008

* cited by examiner

*Primary Examiner* — Amanda C. Walke
(74) *Attorney, Agent, or Firm* — Jonathan D. Baskin

(57) ABSTRACT

Methods of adjusting dimensions of resist patterns are provided. The methods allow for control of photoresist pattern dimensions and find particular applicability in resist pattern rework in semiconductor device manufacturing.

20 Claims, 3 Drawing Sheets

METHODS OF ADJUSTING DIMENSIONS OF RESIST PATTERNS

Figure 1:
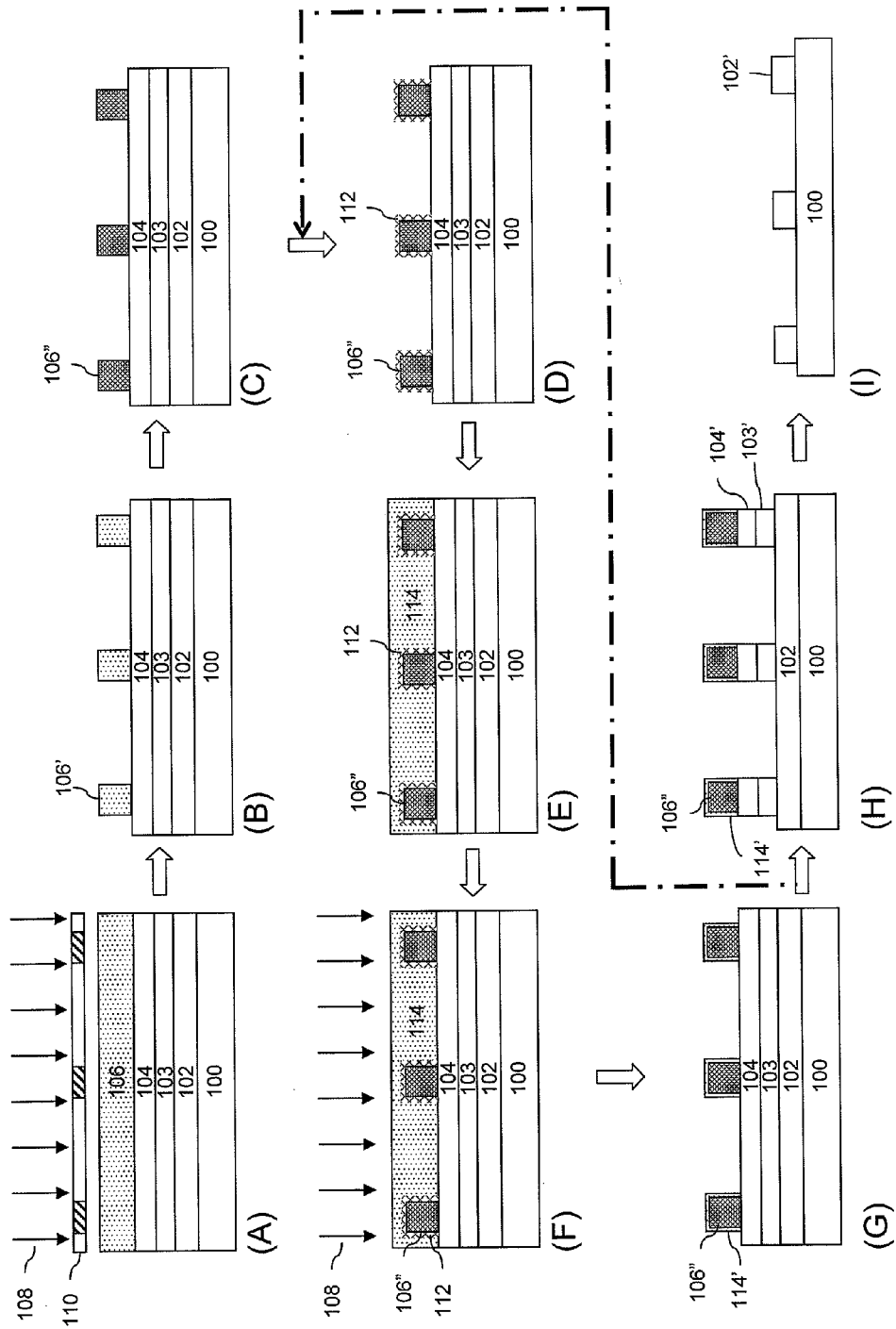

This application claims the benefit of priority under 35 U.S.C. §119(e) to U.S. Provisional Application Nos. 61/269, 600, filed Jun. 26, 2009 and 61/281,681, filed Nov. 19, 2009, the entire contents of which applications are incorporated herein by reference.

This invention relates generally to the manufacture of electronic devices. More specifically, this invention relates to methods of forming photolithographic patterns and, in particular, to methods of adjusting dimensions in resist patterns. The invention finds particular use in the manufacture of semiconductor devices for forming high-density lithographic patterns and features. The invention allows for precise control of critical dimensions in formed lithographic patterns.

In the semiconductor manufacturing industry, photoresist materials are used for transferring an image to one or more underlying layers, such as metal, semiconductor or dielectric layers, disposed on a semiconductor substrate, as well as to the substrate itself. To increase the integration density of semiconductor devices and allow for the formation of structures having dimensions in the nanometer range, photoresists and photolithography processing tools having high-resolution capabilities such as immersion scanners have been and continue to be developed.

The accuracy of a patterned photoresist layer plays an important role in device performance. In this regard, dimensions of the permanent structures making up the formed devices and their electrical characteristics are dependent on an accurate rendering of the resist pattern. With the increase in integration density, however, dimensional accuracy in making the resist patterns is becoming increasingly difficult. For resist patterns which do not meet specification, for example, by having a measured critical dimension (CD) outside of an acceptable specification range, it is known to rework the wafers by stripping of the photoresist from the wafer surface with a solvent and/or plasma treatment and repeating the resist patterning process. Such a process is described, for example, in U.S. Pat. No. 6,218,085B1, which discloses providing a substrate having an oxidizable layer and a photoresist layer, and exposing the substrate to a plasma containing hydrogen and oxygen in an amount effective to strip the photoresist layer. Conventional resist rework processes can be problematic, for example, due to undesired removal of materials underlying the resist pattern, contamination of the wafer surface giving rise to yield loss from patterning defects, electrical defects and/or degradation in device performance.

There is a continuing need in the art for lithographic methods which address one or more of the foregoing problems associated with the state of the art.

In accordance with a first aspect of the invention, methods of adjusting dimensions of a resist pattern are provided. The methods comprise: (a) providing a semiconductor substrate comprising one or more layers to be patterned; (b) applying a first layer of a first photosensitive composition over the one or more layers to be patterned; (c) exposing the first layer to activating radiation through a patterned photomask; (d) developing the exposed first layer to form a resist pattern; (e) measuring a dimension of a feature of the resist pattern; (f) comparing the result of the dimension measurement with a predetermined target specification; (g) heat treating the resist pattern in a first hardbake process; (h) treating the hardbaked resist pattern with a material effective to make alkaline a surface of the resist pattern; (i) heat treating the resist pattern in a second hardbake process at a temperature based on the comparison of the result of the dimension measurement with the predetermined target specification; (j) applying a second layer of a second photosensitive composition over the one or more layers to be patterned and in contact with the alkaline surface of the resist pattern, wherein the second photosensitive composition is positive-acting and comprises a resin component and a photoacid generator; (k) exposing the second layer to activating radiation; and (l) developing the exposed second layer.

In accordance with a further aspect of the invention, methods of adjusting dimensions of a resist pattern are provided. The methods comprise: (a) providing a semiconductor substrate comprising one or more layers to be patterned; (b) applying a first layer of a photosensitive composition over the one or more layers to be patterned; (c) exposing the first layer to activating radiation through a patterned photomask; (d) developing the exposed first layer to form a resist pattern; (e) measuring a dimension of a feature of the resist pattern; (f) comparing the result of the dimension measurement with a predetermined target specification; (g) heat treating the resist pattern in a first hardbake process; (h) treating the hardbaked resist pattern with a material effective to make alkaline a surface of the resist pattern; (i) heat treating the resist pattern in a second hardbake process at a temperature based on the comparison of the result of the dimension measurement with the predetermined target specification; (j) applying a second layer of a thermally sensitive composition over the one or more layers to be patterned and in contact with the alkaline surface of the resist pattern, wherein the thermally sensitive composition is positive-acting and comprises a resin component and a thermal acid generator; (k) heat treating the second layer; and (l) developing the exposed second layer.

Figure 2:
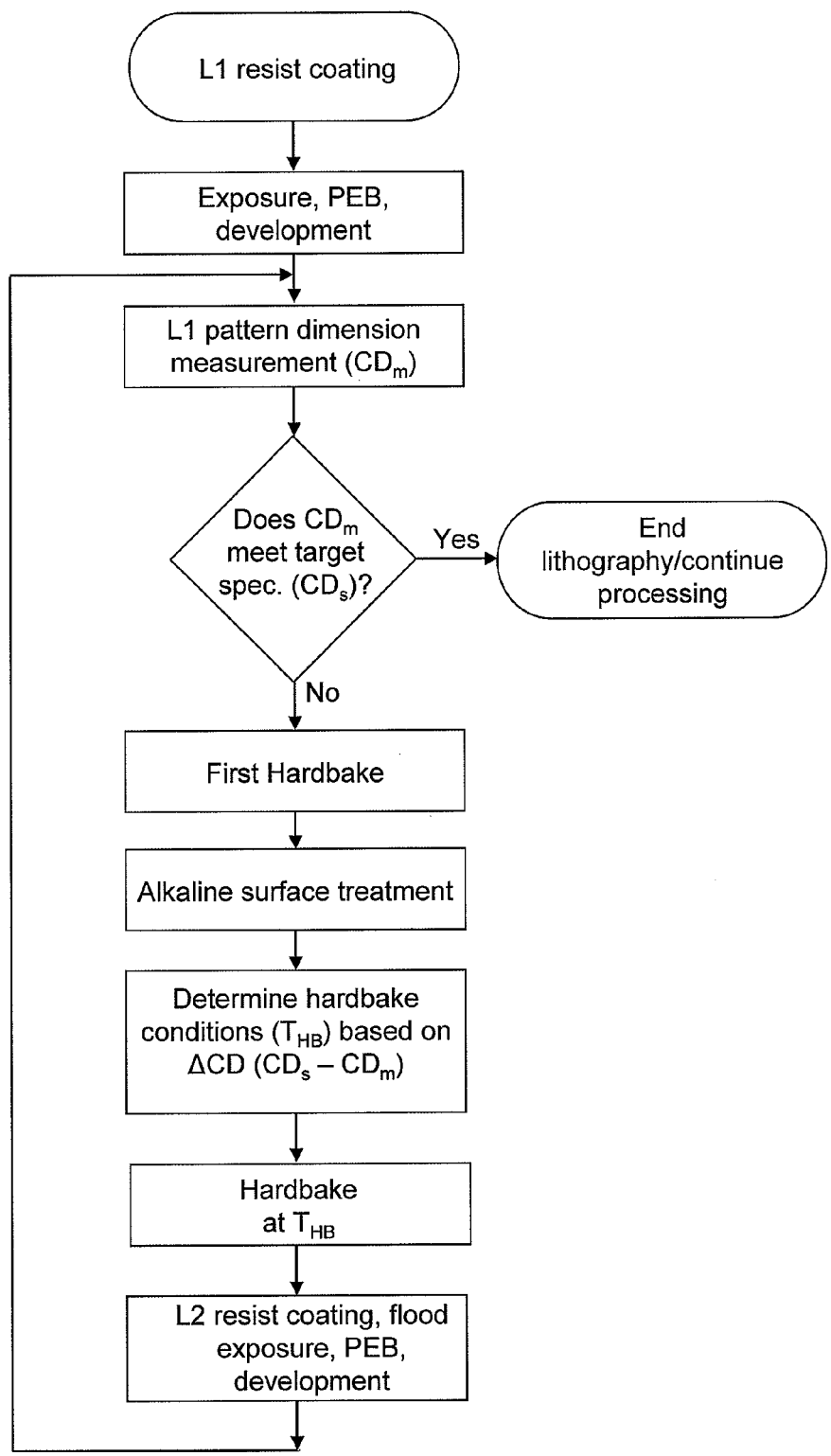
Figure 3:
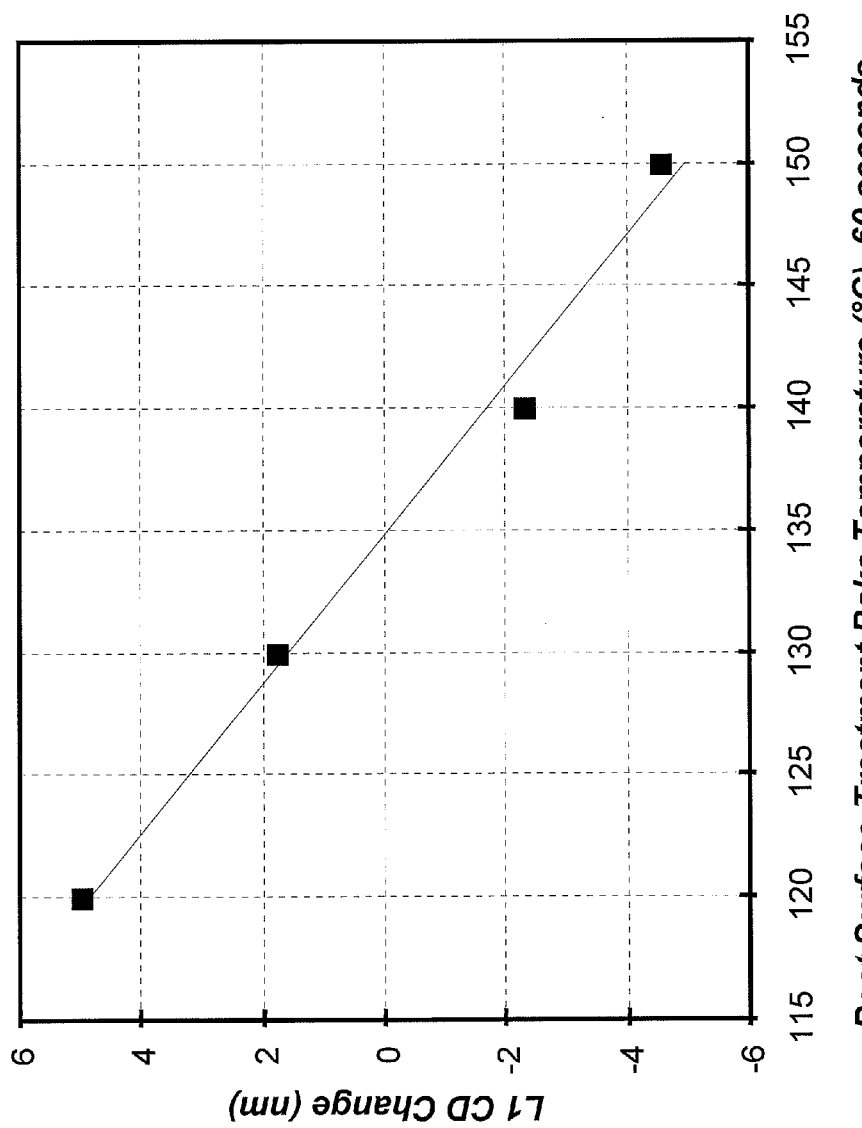

The present invention will be discussed with reference to the following drawings, in which like reference numerals denote like features, and in which:

FIG. 1A-I illustrates a process flow for forming an electronic device in accordance with the invention;

FIG. 2 is a flowchart illustrating a method of forming a resist pattern having predetermined dimensions in accordance with the invention; and FIG. 3 is a graph showing the effect of post surface-treatment bake temperature on the change in dimension of a lithographic pattern in methods in accordance with the invention.

The invention provides methods which can be used to precisely control and rework resist patterns, for example, patterns which are out of specification. The invention will now be described with reference to FIGS. 1 and 2. FIG. 1A depicts a substrate 100 which may include various layers and features formed on a surface thereof. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example: chemical vapor deposition (CVD) such as plasma-enhanced CVD, low-pressure CVD or epitaxial growth; physical vapor deposition (PVD) such as sputtering or evaporation; or electroplating. The particular thickness of the one or more layers to be etched 102 will vary depending on the materials and particular devices being formed.

Depending on the particular layers to be etched, film thicknesses and photolithographic materials and process to be used, it may be desired to dispose over the layers 102 a hard mask layer 103 and/or a bottom antireflective coating (BARC) 104 over which a photoresist layer is to be coated. Use of a hard mask layer may be desired, for example, with very thin resist layers, where the layers to be etched require a significant etching depth, and/or where the particular etchant has poor resist selectivity. Where a hard mask layer is used, the resist patterns to be formed can be transferred to the hard mask layer which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer 103 can include a single layer or a plurality of layers of different materials. The hard mask layer can be formed, for example, by chemical or physical vapor deposition techniques.

A bottom antireflective coating 104 may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm), ArF excimer laser light (193 nm), electron beams and soft x-rays. The antireflective coating 104 can comprise a single layer or a plurality of different layers. Suitable antireflective materials and methods of formation are known in the art. Antireflective materials are commercially available, for example, those sold under the AR trademark by Rohm and Haas Electronic Materials LLC (Marlborough, Mass. USA), such as AR™40A and AR™124 antireflectants.

A first photosensitive composition is applied on the substrate over the antireflective layer 104 (if present) to form a first photosensitive layer 106. As used herein, the terms "photosensitive material(s)", "photosensitive composition(s)" and "photoresist(s)" are used interchangeably. Suitable photoresist materials are known in the art and include, for example, those based on acrylate, novolak and silicon chemistries. Suitable resists are described, for example, in U.S. Application Publication Nos. US20090117489 A1, US20080193872 A1, US20060246373 A1, US20090117489 A1, US20090123869 A1 and U.S. Pat. No. 7,332,616. The photoresist materials useful in the methods of the invention include both positive- and negative-acting materials. Suitable positive-acting materials include positive-acting chemically amplified photoresists which undergo a photoacid-promoted deprotection reaction of acid labile groups of one or more components of the composition to render exposed regions of a coating layer of the resist more soluble in an aqueous developer than unexposed regions. Typical photoacid-labile groups of the photoresist resins include ester groups that contain a tertiary non-cyclic alkyl carbon (e.g., t-butyl) or a tertiary alicyclic carbon (e.g., methyladamantyl) covalently linked to the carboxyl oxygen of the ester. Acetal photoacid-labile groups also are typical.

The photosensitive composition comprises a resin component and a photoactive component. The resin preferably has functional groups that impart alkaline aqueous developability to the resist composition. For example, typical are resin binders that comprise polar functional groups such as hydroxyl or carboxylate. The resin component is used in the composition in an amount sufficient to render an exposed layer of the composition developable in a developer solution, such as an aqueous alkaline solution. The resin component will typically comprise about 70 to about 97 wt % of total solids of the resist.

The photosensitive composition further comprises a photoactive component employed in an amount sufficient to generate a latent image in a coating layer of the composition upon exposure to activating radiation. For example, the photoactive component will suitably be present in an amount of from about 1 to 20 wt % of total solids of the resist. Typical photoactive components in the resist compositions are photoacid generators. Suitable PAGs are known in the art of chemically amplified photoresists and include, for example: onium salts, for example, triphenyl sulfonium salts, nitrobenzyl derivatives, sulfonic acid esters, diazomethane derivatives, glyoxime derivatives, sulfonic acid ester derivatives of an N-hydroxyimide compound and halogen-containing triazine compounds. One or more of such PAGs can be used.

A typical optional additive of the resists is an added base, particularly tetrabutylammonium hydroxide (TBAH), or tetrabutylammonium lactate, which can enhance resolution of a developed resist relief image. For resists imaged at 193 nm, a typical added base is a hindered amine such as diazabicyclo undecene or diazabicyclononene. The added base is suitably used in relatively small amounts, for example, about 0.03 to 5 wt % relative to the total solids.

Photoresists used in accordance with the invention also may contain other optional materials. For example, other optional additives include anti-striation agents, plasticizers and speed enhancers. Such optional additives typically will be present in minor concentrations in a photoresist composition except for fillers and dyes which may be present in relatively large concentrations, for example, in amounts of from about 0.1 to 10 wt % based on the total weight of a resist's dry components.

Suitable negative-acting resists typically will contain a crosslinking component. The crosslinking component is typically present as a separate resist component. Amine-based crosslinkers such as a melamine, for example, the Cymel melamine resins, are typical. Negative-acting photoresist compositions useful in the invention comprise a mixture of materials that will cure, crosslink or harden upon exposure to acid, and a photoactive component of the invention. Particularly useful negative acting compositions comprise a resin binder such as a phenolic resin, a crosslinker component and a photoactive component. Such compositions and the use thereof are disclosed in European Patent Nos. EP0164248B1 and EP0232972B1, and in U.S. Pat. No. 5,128,232. Typical phenolic resins for use as the resin binder component include novolaks and poly(vinylphenol)s such as those discussed above. Typical crosslinkers include amine-based materials, including melamine, glycolurils, benzoguanamine-based materials and urea-based materials. Melamine-formaldehyde resins are generally most typical. Such crosslinkers are commercially available, for example: the melamine resins sold by Cytec Industries under the trade names Cymel 300, 301 and 303; glycoluril resins sold by Cytec Industries under the trade names Cymel 1170, 1171, 1172; urea-based resins sold by Teknor Apex Company under the trade names Beetle 60, 65 and 80; and benzoguanamine resins sold by Cytec Industries under the trade names Cymel 1123 and 1125. For imaging at sub-200 nm wavelengths such as 193 nm, typical negative-acting photoresists are disclosed in International Application Pub. No. WO 03077029.

The photoresists useful in the invention are generally prepared following known procedures. For example, a resist can be prepared as a coating composition by dissolving the components of the photoresist in a suitable solvent, for example, a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. Typically the solids content of the photoresist varies between about 2 and 25 wt % based on the total weight of the photoresist composition. Blends of such solvents also are suitable.

The methods of the invention can be used with a variety of imaging wavelengths, for example, radiation having a wavelength of sub-400 nm, sub-300 or sub-200 nm exposure wavelength, with I-line (365 nm), 248 nm and 193 nm being typical exposure wavelengths, as well as EUV and 157 nm. In an exemplary aspect, the photoresists are suitable for use with and imaged at a sub-200 nm wavelength such as 193 nm. At such wavelengths, the use of immersion lithography is typical although dry processing can be used. In immersion lithography, a fluid (i.e., an immersion fluid) having a refractive index of between about 1 and about 2 is maintained between an exposure tool and the photoresist layer during exposure. A topcoat layer is typically disposed over the photoresist layer to prevent direct contact between the immersion fluid and photoresist layer to avoid leaching of components of the photoresist into the immersion fluid.

The photosensitive composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the first photosensitive layer 106 is from about 500 to 1500 Å. The first photosensitive layer can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photosensitive layer and thickness. Typical softbakes are conducted at a temperature of from about 90 to 150° C., and a time of from about 30 to 90 seconds.

If the first photosensitive layer 106 is to be exposed with an immersion lithography tool, for example a 193 nm immersion scanner, a topcoat layer (not shown) can be disposed over the photosensitive layer 106. Use of such a topcoat layer can act as a barrier between the immersion fluid and underlying photosensitive layer. In this way, leaching of components of the photosensitive composition into the immersion fluid, possibly resulting in contamination of the optical lens and change in the effective refractive index and transmission properties of the immersion fluid, can be minimized or avoided. Suitable topcoat compositions are commercially available, for example, OPTICOAT™ topcoat materials such as OC™ 2000 (Rohm and Haas Electronic Materials) and otherwise known in the art, for example, those described in U.S. Patent Application Pub. No. 2006/0246373A1 and in U.S. Provisional Application Nos. 61/204,007, filed Dec. 31, 2008. Such compositions can be applied over the photosensitive layer by any suitable method such as described above with reference to the photosensitive compositions, with spin coating being typical. The topcoat layer thickness is typically $\lambda/4n$ (or an odd multiple thereof), wherein $\lambda$ is the wavelength of the exposure radiation and n is the refractive index of the topcoat layer. If a topcoat layer is present, the first photosensitive layer 106 can be softbaked after the topcoat layer composition has been applied rather than prior to topcoat application. In this way, the solvent from both layers can be removed in a single thermal treatment step.

The first photosensitive layer 106 is next exposed to activating radiation 108 through a first photomask 110 to create a difference in solubility between exposed and unexposed regions. For a positive-acting material, as illustrated, the photomask has optically transparent and optically opaque regions, the optically transparent regions corresponding to regions of the photosensitive layer to be removed in a subsequent development step. For negative-acting materials, the optically opaque regions would correspond with portions of the resist layer to be developed away. The exposure energy is typically from about 1 to 100 mJ/cm², dependent upon the exposure tool and the components of the photosensitive composition. References herein to exposing a photosensitive composition to radiation that is activating for the composition indicates that the radiation is capable of forming a latent image in the photosensitive composition such as by causing a reaction of the photoactive component, for example, by producing photoacid from a photoacid generator compound. The photosensitive compositions are typically photoactivated by a short exposure wavelength, particularly a sub-400 nm, sub-300 or sub-200 nm exposure wavelength, with I-line (365 nm), 248 nm and 193 nm being typical exposure wavelengths, as well as EUV and 157 nm.

Following exposure of the first photosensitive layer 106, a post-exposure bake (PEB) of the photosensitive layer is performed at a temperature above the softening point of the layer. The PEB can be conducted, for example, on a hotplate or in an oven. Conditions for the PEB will depend, for example, on the particular material of the photosensitive layer and thickness. The PEB is typically conducted at a temperature of from about 80 to 150° C., and a time of from about 30 to 90 seconds.

The exposed photosensitive layer 106 is next developed to form a first resist pattern 106' as shown in FIG. 1B. While the developer material will depend on the particular material of the photosensitive layer 106, suitable developers and development techniques are known in the art. Typical developers include, for example, aqueous base developers such as quaternary ammonium hydroxide solutions, for example, tetra-alkyl ammonium hydroxide solutions such as 0.26 N tetramethylammonium hydroxide.

Following development, a critical dimension ($CD_m$) of the first resist pattern 106" is measured. This dimensional measurement is typically made by an SEM. The measurement is compared to a predetermined specification ($CD_s$) which is typically a target value plus or minus an acceptable deviation range. The methods can be at least partially automated, for example, by inclusion of one or more processor and controller connected to the measurement and process equipment. This comparison thus can be conducted manually or automatically using a controller system known to those skilled in the art. If the measured value meets the specification, the lithography process is completed and processing of the substrate can continue. In the event the measured value is outside of the specification range, the following processing is conducted to correct the critical dimension value of the resist pattern.

The first resist pattern 106' is heat-treated in a first hardbake process to further remove solvent from the resist and to form a hardened resist pattern 106", as shown in FIG. 1C. The hardbake is typically conducted with a hot plate or oven, and is typically conducted at a temperature of about 150° C. or higher, for example, from about 170 to 180° C., and a time of from about 30 to 120 seconds.

With reference to FIG. 1D, the hardbaked first resist pattern 106" is treated with a material effective to make alkaline a surface of the first resist pattern. The alkaline surface interferes with reaction during exposure of a subsequently applied photosensitive layer over the resist pattern. For example, in the case of a positive-acting photosensitive layer, acid-catalyzed deprotection reaction is prevented in regions in the immediate vicinity of the underlying alkaline-treated resist pattern. As a consequence, portions of the photosensitive layer would remain in those regions after development.

While not limited thereto, particularly suitable materials comprise an alkaline material and a surfactant which is different from the alkaline material. It is believed that the surfactant promotes formation of a substantially uniform coating layer of the second resist over the alkaline material treated resist pattern.

The alkaline material can take various forms, and may be in the form of a solution formed by dissolving a solid compound in a suitable solvent. Suitable alkaline materials for the resist pattern treatment include, for example, aqueous base developers such as quaternary ammonium hydroxide solutions, for example, tetra-alkyl ammonium hydroxide solutions such as 0.26 Normality (N) (2.38 wt %) tetramethylammonium hydroxide (TMAH). Solvent materials used for the alkaline material and otherwise in the compositions should not dissolve or minimize dissolution of the underlying photoresist The alkaline material (absent any solvent, e.g., water, alcohol or the like) is typically present in the compositions in an amount of from about 1 to 10 wt %, based on the total composition.

Suitable surfactants for the resist pattern treatment compositions include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly(alkylene oxide) surfactants, and fluorochemical surfactants. Suitable non-ionic surfactants for use in the aqueous solution include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J.

Nonionic surfactants that are acetylenic diol derivatives also can be suitable, including such surfactants of the following formulae:

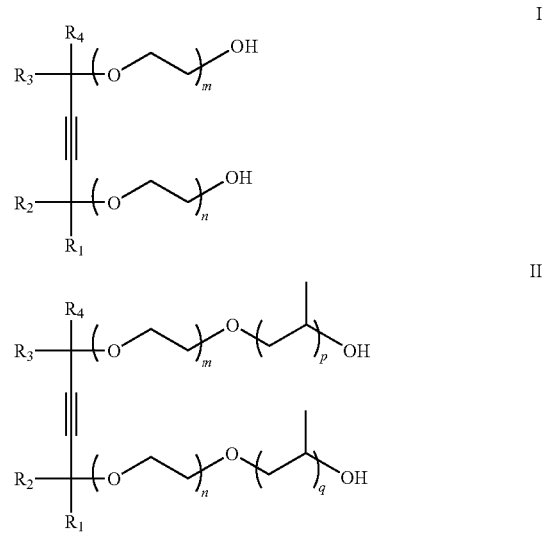

wherein $R_1$ and $R_4$ are a straight or a branched alkyl chain having from 3 to 10 carbon atoms; $R_2$ and $R_3$ are either H or an alkyl chain suitably having from 1 to 5 carbon atoms; and m, n, p, and q are numbers that range from 0 to 20. Such surfactants are commercially available from Air Products and Chemicals, Inc. of Allentown, Pa. trade names of SUR-FYNOL® and DYNOL®.

Additional suitable surfactants for use in coating compositions of the invention include other polymeric compounds such as the tri-block EO-PO-EO co-polymers PLURONIC® 25R2, L121, L123, L31, L81, L101 and P123 (BASF, Inc.).

Particularly suitable surfactants include amines, typically primary and secondary amines, i.e., an amine including one or more primary amine groups and one or more secondary amine groups, respectively, and combinations thereof. Tertiary amine groups can be present in addition to the primary and/or secondary amine groups. Typically, the amine is a multifunctional amine. The amine can be a polyamine, such as a diamine, triamine or tetra-amine. Suitable primary amines include compounds of the following formula (I):

wherein R is chosen from optionally substituted alkyl such as optionally substituted C1 to C6 alkyl, such as methyl, ethyl or propyl, with ethyl being typical. Other suitable primary amines include poly(allyl amines) represented by the following formula (II):

wherein: $R_1$ is chosen from hydrogen and optionally substituted alkyl such as C1 to C3 alkyl; $R_2$ is chosen from optionally substituted alkylene such as C1 to C6 alkylene, typically methylene or ethylene; and n is an integer greater than or equal to 3. In an exemplary primary amine of the formula (N-II), $R_1$ is hydrogen and $R_2$ is methylene. Other suitable amines include those represented by the following general formulae (III), (IV) and (V):

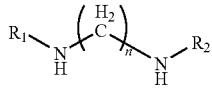
(III)

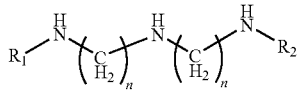
(IV)

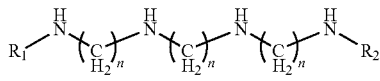
(V)

wherein $R_1$ and $R_2$ are each independently a hydrogen atom or an alkyl group with 1 to 10 carbon atoms, and n is an integer from 1 to 10. Other suitable amines include the following:

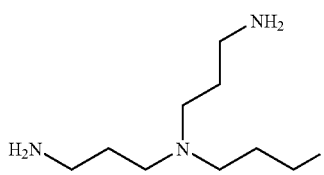
A-1

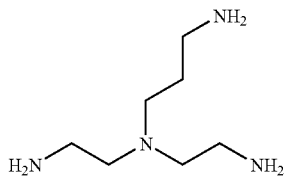
A-2

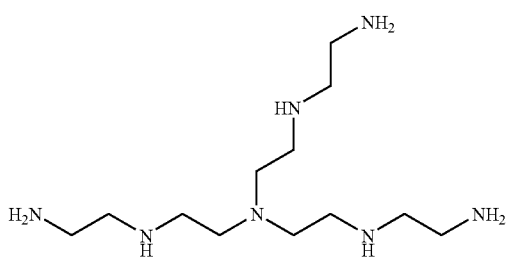
A-3

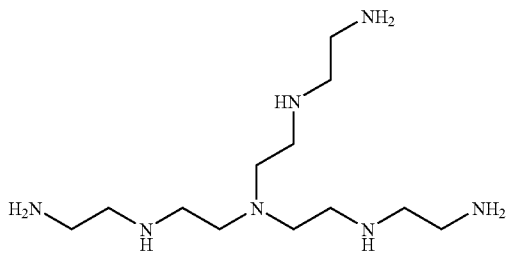
A-4

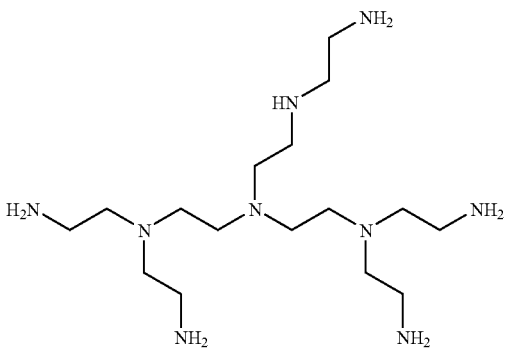
A-5

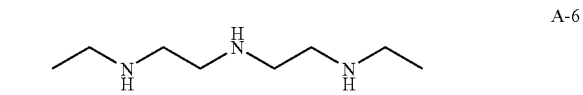
A-6

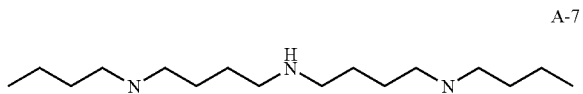
A-7

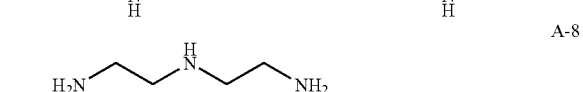
A-8

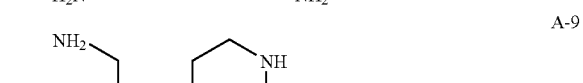
A-9

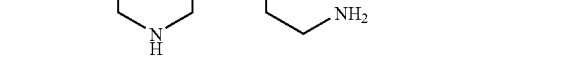

Of these, tris(2-aminoethyl)amine (TAEA) is particularly preferred.

The surfactant is typically present in the compositions in a relatively small amount, for example, from 0.01 to 5 wt %, for example, from 0.01 to 1 wt %, based on the weight of total solids in the composition (total solids being all compositions components except solvent carrier).

The resist pattern treatment compositions can comprise one or more optional components in addition to the alkaline material and surfactant components. For example, the compositions can include one or more solvent in addition to any solvent used for the alkaline material and surfactant. As described above, solvent materials used for the alkaline material and otherwise in the compositions should not dissolve or minimize dissolution of the underlying photoresist. Suitable solvents will therefore depend on the particular underlying resist material and may include, for example, water and alcohols such as n-butanol. The optional components also include one or more base generator compound, such as a thermal base generator compound and/or a photobase generator compound.

The photoresist pattern treatment compositions can be prepared by admixture in any order of the alkaline material and surfactant components, and any additional components such as solvent and base generator compounds. One or more of the components can be added as a solid or as a pre-mixed solution using a suitable solvent.

Preferably, the alkaline treatment includes treatment with a quaternary ammonium hydroxide and an amine. The quaternary ammonium hydroxide material and amine can be simultaneously applied to the substrate, for example, either from a premixed composition or by applying the materials simultaneously but separate from one another in which case the composition is formed in situ. Preferably, the quaternary ammonium hydroxide material and amine are sequentially applied in that order. The quaternary ammonium hydroxide and amine materials can be applied as a liquid, gas or vapor, and can be applied, for example, by spin-coating, dipping, vapor-coating, chemical vapor deposition (CVD) or other conventional coating technique. Of these, spin-coating of liquid materials is typical. Typically, the quaternary ammonium hydroxide and amine materials can be applied as aqueous solution(s). Where the quaternary ammonium hydroxide and amine are applied simultaneously, the surface treated substrate can be rinsed, for example, with deionized water. Where the quaternary ammonium hydroxide and amine materials are sequentially applied, the amine can be applied as an aqueous solution, functioning also as a water rinse. The surface treated substrate can optionally be rinsed, for example, with deionized water to remove excess composition.

A critical dimension (CD) of the first resist pattern 106" becomes slightly reduced as a result of the surface treatment as compared with the original CD of resist pattern 106'. This CD loss is believed to be attributed to further development of the first resist pattern during the surface treatment. The surface treatment forms a modified first resist pattern surface 112 which is alkaline and which has a line width roughness less than that of the pre-treated surface.

Following the surface treatment, the substrate is heat-treated in a second hardbake process. Dimensions of the first resist pattern resulting from the process can be accurately adjusted and controlled by selection of appropriate conditions of the second hardbake. This heat-treatment process is typically conducted on a hotplate or in an oven, and conditions will depend, for example, on the particular material and thickness of the resist pattern, the second resist material, surface treatment chemistry, hardbake time and the desired change in CD of the pattern. Typical conditions for the optional heat treatment include a temperature of from about 120 to 200° C. and a time of from about 60 to 120 seconds.

With reference to FIG. 3, it has been found that the CD of the first resist pattern following development of the second resist layer 114 decreases with an increase in the second hardbake (after alkaline surface treatment) temperature and increases with a decrease in the second hardbake temperature as compared with the CD prior to the surface treatment process. Based on this finding, it is possible to precisely control CD growth with the second hardbake process by selection of appropriate second hardbake conditions. More specifically, one can select an appropriate bake temperature which would result in a desired increase or decrease in the CD. Based on the difference between the target CD specification ($CD_s$) and measured CD ($CD_m$) values, appropriate hardbake conditions are determined based on the predetermined relationship between critical dimension change and hardbake conditions, for example, as illustrated in FIG. 3. While the exact relationship between change in CD and hardbake temperature will depend on the particular materials used for the first resist pattern, surface treatment chemistry and second photoresist composition, FIG. 3 is illustrative of the general relationship. As a result of this relationship, it is possible to further adjust the dimensions of the resist pattern obtained after development of the second resist layer by repeating the processes described above beginning with first hardbake through development, as indicated by the dashed arrow in FIG. 1. The sequence can be repeated one or more times to obtain a desired CD, such as a desired line width or space.

A second photosensitive composition as described above is coated over the first resist pattern 106" and BARC layer 104 to form a second photosensitive layer 114, as shown in FIG. 1E. The second photosensitive composition can be the same or different from the first photosensitive composition and, except as otherwise stated, can be applied and processed in the same manner including the materials and conditions described above with respect to the first photosensitive layer. While the first photosensitive composition can be a positive-acting or negative-acting material, the tone of the second photosensitive composition is positive-acting. In the illustrated method, both the first and second photosensitive compositions are positive acting.

The second photosensitive layer 114 can next be softbaked. If the second photosensitive layer 114 is to be exposed with an immersion lithography tool, a topcoat layer (not shown) as described above can be disposed over the second photosensitive layer 114. If a topcoat layer is used, the second photosensitive layer 114 can be softbaked after the topcoat layer composition has been applied rather than prior to its application.

With reference to FIG. 1(F), the second photosensitive layer 114 is exposed to activating radiation 108. Depending on the particular application and purpose of the process, the second photosensitive layer can be flood-exposed, as illustrated, or can be patternwise exposed through a photomask to activating radiation. The exposed second photosensitive layer is heat-treated in a post-exposure bake and developed. The alkaline-modified surface region 112 of the first resist pattern 106" prevents photoreaction in the second resist layer 114 in the vicinity of the surface region. As a result, a layer 114' of the unreacted second photosensitive composition remains over the first resist pattern 106". The resulting developed image has an improved (i.e., reduced) surface roughness as compared with that of the resist pattern following development of the first photoresist layer. Following development of the second photosensitive layer, the pattern critical dimension is again measured and the process is repeated until the dimension meets the specification limit.

The BARC layer 104 is selectively etched using the modified first resist pattern 106" as an etch mask to expose the underlying hardmask layer 103. The hardmask layer is next selectively etched, again using the modified first resist pattern 106" as an etch mask, resulting in patterned BARC and hardmask layers 104', 103', as shown in FIG. 1H. Suitable etching techniques and chemistries for etching the BARC layer and hardmask layer are known in the art and will depend, for example, on the particular materials of these layers. Dry-etching processes such as reactive ion etching are typical. The modified first resist pattern 106" and patterned BARC layer 104' are next removed from the substrate using known techniques, for example, an oxygen plasma ashing.

Using the hardmask pattern 103' as an etch mask, the one or more layers 102 are selectively etched. Suitable etching techniques and chemistries for etching the underlying layers 102 are known in the art, with dry-etching processes such as reactive ion etching being typical. The patterned hardmask layer 103' can next be removed from the substrate surface using known techniques, for example, a dry-etching process such as reactive ion etching. The resulting structure is a pattern of etched features 102' as illustrated in FIG. 1I.

In an alternative exemplary method, it may be desirable to pattern the layer 102 directly using the modified first photoresist pattern 106" without the use of a hardmask layer 103. Whether direct patterning with the resist patterns can be employed will depend on factors such as the materials involved, resist selectivity, resist pattern thickness and pattern dimensions.

In an alternative exemplary method, a non-photoimageable thermally-sensitive composition can be used in place of the photosensitive composition for the second layer 114. Thermally-sensitive compositions are as described above with respect to the first photosensitive compositions except a thermally-sensitive component such as a thermal acid generator (TAG) is used in place of the photoactive component. Suitable TAGs are known in the art. For example, in the case of a material based on a deprotection reaction, suitable TAGs include any that on heating generate an acid which can cleave the bond of the acid labile group of the thermally-sensitive layer 114, particularly a strong acid such as a sulfonic acid. Typically, the thermal acid generator is activated at above 90°, for example, above 120° C. or above 150° C. The thermally-sensitive layer is heated for a sufficient length of time for the thermal acid generator to react with the resin component of the composition. Examples of thermal acid generators include nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Typically, the TAG will have a very low volatility at temperatures between 170 and 220° C. Examples of TAGs include those sold by King Industries, Norwalk, Conn. USA under NACURE™, CDX™ and K-PURE™ names, for example, NACURE 5225, CDX-2168E, K-PURE™ 2678 and K-PURE™ 2700. The thermally-sensitive component is typically present in the composition in an amount of from about 1 to 20 wt % based on the total solids of the composition.

The invention can be applied to a variety of situations in the manufacture of electronic devices. For example, the invention finds particular use in the rework of out-of-specification lithographic patterns and improvement in resist pattern line width roughness. Resist patterns can be controllably trimmed or widened as desired.

EXAMPLES

Example 1

L1 Resist Polymer
(Poly(IAM/α-GBLMA/ODOTMA/HAMA))
Synthesis 10.51 g of 2-methyl-acrylic acid 1-isopropyl-adamantanyl ester (IAM), 6.82 g of 2-methyl-acrylic acid 2-oxo-tetrahydro-furan-3yl ester (α-GBLMA), 6.36 g of 2-methyl-acrylic acid 3-oxo-4,10-dioxa-tricyclo[5.2.1.0$^{2,6}$]dec-8-yl ester (ODOTMA) and 6.31 g of 2-methyl-acrylic acid 3-hydroxy-adamantanyl ester (HAMA) are dissolved in 27 g of tetrahydrofuran (THF). The mixture is degassed by bubbling with nitrogen for 20 minutes. A 500 ml flask equipped with a condenser, nitrogen inlet and mechanical stirrer is charged with 11 g of THF, and the solution is brought to a temperature of 67° C. 5.23 g of dimethyl-2,2-azodiisobutyrate (17 mol % based on total monomers) is dissolved in 5 g of THF and charged into the flask. The monomer solution is fed into a reactor at a rate of 16.0 milliliters per hour (mL/h) for 3 hours 30 minutes. The polymerization mixture is then stirred for an additional 30 minutes at 67° C. 5 g of THF is next added to the reactor and the polymerization mixture is cooled to room temperature. Precipitation is carried out in 1.0 L of isopropyl alcohol. After filtration, the polymer is dried, re-dissolved in 50 g of THF, re-precipitated into 1.1 L of isopropyl alcohol, filtered and dried in a vacuum oven at 45° C. for 48 hours. 25.4 g of the poly(IAM/α-GBLMA/ODOTMA/HAMA) polymer (Mw=7,934 and Mw/Mn=~1.46) shown below is expected:

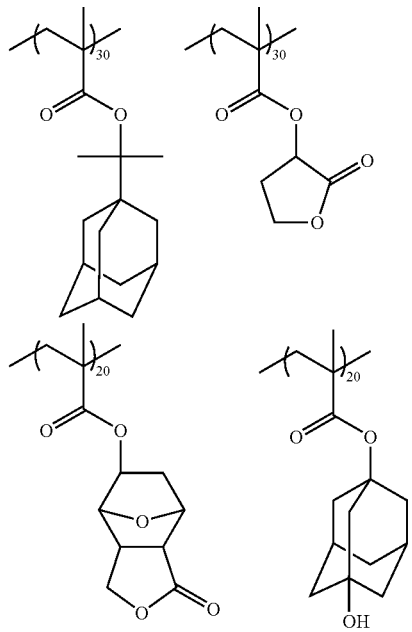

L1 Resist Formulation 3.169 g of a polymer as described above is dissolved in 96.38 g of a solvent mixture of 70 wt % propylene glycol monomethyl ether acetate (PGMEA) and 30 wt % cyclohexanone. To this mixture is added 0.405 g of triphenylsulfonium (adamantan-1yl methoxycarbonyl)-difluoro-methane-sulfonate, 0.041 g of 1-(tert-butoxycarbonyl)-4-hydroxypiperidine and 0.005 g of POLYFOX® PF-656 surfactant (Omnova Solutions Inc.). The resulting mixture is rolled on a roller for six hours and then filtered through a Teflon filter having a 0.2 micron pore size. A positive-acting photoresist composition is thereby expected to be formed.

Surface Treatment Solution Formulation

A surface treatment solution is prepared by mixing 47.601 g of tetramethylammonium hydroxide (TMAH) solution (25 wt % in deionized water) (Sigma-Aldrich), 0.5 g of tris(2-aminoethyl)amine TAEA (Sigma-Aldrich), and 451.90 g of deionized water. The solution is filtered through a nylon filter having a 0.1 micron pore size.

First Lithography (L1) Patterning of Lines and Spaces

A 300 mm silicon wafer is spin-coated with AR™40A antireflectant (Rohm and Haas Electronic Materials LLC) to form a first bottom antireflective coating (BARC) on a TEL CLEAN TRACK™ LITHIUS™ i+ coater/developer. The wafer is baked for 60 seconds at 215° C., yielding a first BARC film thickness of 75 nm. A second BARC layer is next coated over the first BARC using AR™124 antireflectant (Rohm and Haas Electronic Materials), and is baked at 205° C. for 60 seconds. A 23 nm top BARC layer is expected.

An L1 photoresist composition as described above is coated on top of the dual BARCs and soft-baked at 110° C. for 60 seconds. A resist film thickness of 950 Å is expected. The first resist layer is coated with a topcoat layer (OC™2000 topcoat material, Rohm and Haas Electronic Materials) and exposed at various doses from 16 to 38 mJ/cm² through a binary reticle having critical dimensions of 45 nm lines and spaces (L/S) at 90 nm pitch using an ASML TWINSCAN™ XT:1900i immersion scanner with a numerical aperture of 1.35 and dipole-35Y illumination (0.89 outer sigma/0.76 inner sigma) with X-polarization. The wafer is then post-exposure baked (PEB) at 100° C. for 60 seconds and developed for 12 seconds using Microposit™ MF CD-26 developer (Rohm and Haas Electronic Materials) to render first lithography (L1) patterns.

Dimensional Measurement

A line CD of the resist pattern is measured with an SEM. The measured value is compared with a predetermined target specification for that CD. The measured value is 2 nm greater than the target value.

Curing and Surface Treatment

The wafer is hardbaked (first hardbake) at 180° C. for 60 seconds. The wafer is next rinsed with the surface treatment solution formulation described above on the TEL wafer track with wafer spin. The wafer is then rinsed with deionized water to remove excess surface treatment solution.

Second Hardbake

Assuming for illustration purposes that the relationship shown in FIG. 3 is characteristic of the system (e.g., L1 and L2 resists and surface treatment chemistry), a post surface-treatment bake (second hardbake) temperature of 141° C. is required to reduce the L1 CD by 2 nm to bring it into specification. The wafer is hardbaked at 141° C. for 60 seconds.

Second Lithography (L2)

EPIC™2098 positive photoresist (Rohm and Haas Electronic Materials) is coated over the surface treated L1 patterns on the coater/developer at a spin speed that would provide a film thickness of 650 Å on a bare silicon wafer. The wafer is soft-baked at 120° C. for 60 seconds, and then coated with OC™ 2000 topcoat material (Rohm and Haas Electronic Materials). The second lithography (L2) is carried out using the same scanner settings as in the first lithographic process but using flood exposure with no mask at various exposure doses of from 12 to 34 mJ/cm². The wafer is then post-exposure baked (PEB) at 90° C. for 60 seconds and developed for 12 seconds using Microposit™ MF CD-26 developer (Rohm and Haas Electronic Materials). The line CD is again measured. The line CD is reduced by 2 nm to bring it into specification.

Examples 2-9

The procedures described above with respect to Example 1 are repeated except substituting an amine of formula (A-2) to (A-9) described above, respectively, in place of the TAEA. The second hardbake temperature is chosen based on the respective characteristic L1 CD change vs. bake temperature curve for the particular system used. It is expected that a reduction in line CD of 2 nm between L1 development and L2 development would result.

What is claimed is:

1. A method of adjusting dimensions of a resist pattern, comprising:
   (a) providing a semiconductor substrate comprising one or more layers to be patterned;
   (b) applying a first layer of a photosensitive composition over the one or more layers to be patterned;
   (c) exposing the first layer to activating radiation through a patterned photomask;
   (d) developing the exposed first layer to form a resist pattern;
   (e) measuring a dimension of a feature of the resist pattern;
   (f) comparing the result of the dimension measurement with a predetermined target specification;
   (g) heat treating the resist pattern in a first hardbake process;
   (h) treating the hardbaked resist pattern with a material effective to make alkaline a surface of the resist pattern;
   (i) heat treating the resist pattern in a second hardbake process at a temperature based on the comparison of the result of the dimension measurement with the predetermined target specification;
   (j) applying a second layer of a thermally sensitive composition over the one or more layers to be patterned and in contact with the alkaline surface of the resist pattern, wherein the thermally sensitive composition is positive-acting and comprises a resin component and a thermal acid generator;
   (k) heat treating the second layer; and
   (l) developing the exposed second layer.

2. The method of claim 1, wherein the step of exposing the layer of the first photosensitive composition is conducted with immersion lithography.

3. The method of claim 1, wherein treating the hardbaked first resist pattern with the material effective to make alkaline a surface of the first resist pattern comprises treating the first resist pattern with an alkaline material and a surfactant.

4. The method of claim 1, further comprising repeating steps (e), (f), (g), (h), (i), (j), (k) and (l) one or more additional times.

5. The method of claim 1, wherein the first hardbake process is conducted at a temperature of about 150° C. or higher.

6. The method of claim 1, wherein the second hardbake process is conducted at a temperature of from 120 to 200° C.

7. The method of claim 1, wherein a dimension of a feature of the resist pattern after developing the exposed second layer is increased as compared with a corresponding dimension of the resist pattern prior to the first hardbake process.

8. The method of claim 1, wherein a dimension of a feature of the resist pattern after developing the exposed second layer is decreased as compared with a corresponding dimension of the resist pattern prior to the first hardbake process.

9. The method of claim 1, wherein treating the hardbaked first resist pattern with the material effective to make alkaline a surface of the first resist pattern comprises treating the first resist pattern with a primary or secondary amine.

10. The method of claim 9, wherein treating the hardbaked first resist pattern with the material effective to make alkaline a surface of the first resist pattern comprises sequentially treating the first resist pattern with a quaternary ammonium hydroxide solution followed by the primary or secondary amine.

11. The method of claim 9, wherein the amine is a compound of the following formula (I):

wherein R is chosen from optionally substituted C1-C6 alkyl groups.

12. The method of claim 9, wherein the amine is chosen from compounds of the following formulae (III), (IV) and (V):

-continued

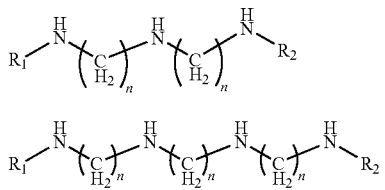

(IV)

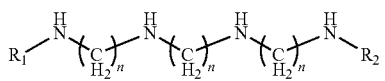

(V)

wherein $R_1$ and $R_2$ are each independently a hydrogen atom or a C1-C10 alkyl group; and n is an integer from 1 to 10.

13. The method of claim 12, wherein the amine is chosen from compounds of the formula (III).

14. The method of claim 12, wherein the amine is chosen from compounds of the formula (IV).

15. The method of claim 12, wherein the amine is chosen from compounds of the formula (V).

16. The method of claim 1, wherein the hardbaked first resist pattern is treated with the material effective to make alkaline a surface of the first resist pattern in a spin coating process.

17. The method of claim 1, wherein treating the hardbaked first resist pattern with the material effective to make alkaline a surface of the first resist pattern comprises treating the first resist pattern with an aqueous base developer.

18. The method of claim 17, wherein the aqueous base developer is a quaternary ammonium hydroxide solution.

19. The method of claim 18, wherein the quaternary ammonium hydroxide solution is a tetramethylammonium hydroxide solution.

20. The method of claim 1, wherein steps (a) to (l) are conducted in sequence.

* * * * *